United States Patent
Laporte et al.

(10) Patent No.: US 9,851,403 B2
(45) Date of Patent: Dec. 26, 2017

(54) SAFETY DEVICE AND METHOD FOR AN ELECTRIC INSTALLATION

(71) Applicant: Schneider Electric Industries SAS, Rueil-Malmaison (FR)

(72) Inventors: Alexandre Laporte, Les Adrets (FR); Francois Vincent, Le Cheylas (FR); Christian Pellegrin, Coublevie (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 329 days.

(21) Appl. No.: 14/486,052

(22) Filed: Sep. 15, 2014

(65) Prior Publication Data

US 2015/0077122 A1    Mar. 19, 2015

(30) Foreign Application Priority Data

Sep. 16, 2013  (FR) ..................................... 13 58888

(51) Int. Cl.
*G01R 31/327*  (2006.01)
*H01H 89/04*  (2006.01)
*H02H 11/00*  (2006.01)

(52) U.S. Cl.
CPC .......... *G01R 31/327* (2013.01); *H01H 89/04* (2013.01); *H02H 11/005* (2013.01); *H02H 11/006* (2013.01)

(58) Field of Classification Search
None
See application file for complete search history.

(56) References Cited

U.S. PATENT DOCUMENTS

| 3,559,055 A | * | 1/1971 | Thomas | ............... | G01R 31/023 |
| | | | | | 324/66 |
| 6,992,872 B2 | * | 1/2006 | Morris | ................. | H02H 11/008 |
| | | | | | 324/509 |

(Continued)

FOREIGN PATENT DOCUMENTS

CA        2 586 812 A1    11/2007

OTHER PUBLICATIONS

French Preliminary Search Report dated Jun. 3, 2014 in French Application 13 58888, filed on Sep. 16, 2013 ( with English Translation of Categories of Cited Documents).

*Primary Examiner* — Melissa Koval
*Assistant Examiner* — Felicia Farrow
(74) *Attorney, Agent, or Firm* — Oblon, McClelland, Maier & Neustadt, L.L.P.

(57) ABSTRACT

A safety device capable of being connected between a circuit breaker device and an electric installation powered by an electric grid providing three-phase current having a first associated frequency, using a line for conveying electric current including three phase conductors, a neutral conductor and a protection conductor. The safety device makes it possible to verify at least one electric safety condition following a cut off of electric power of the electric installation by the circuit breaker device. The safety device comprises circuitry or a processor configured to verify presence of a residual voltage above a predetermined safety threshold on at least one of the conductors, and verify isolation between a tested pair of conductors, among the phase conductors. The safety device can be used to perform an associated safety verification method.

16 Claims, 4 Drawing Sheets

(56) References Cited

U.S. PATENT DOCUMENTS

Figure 1:
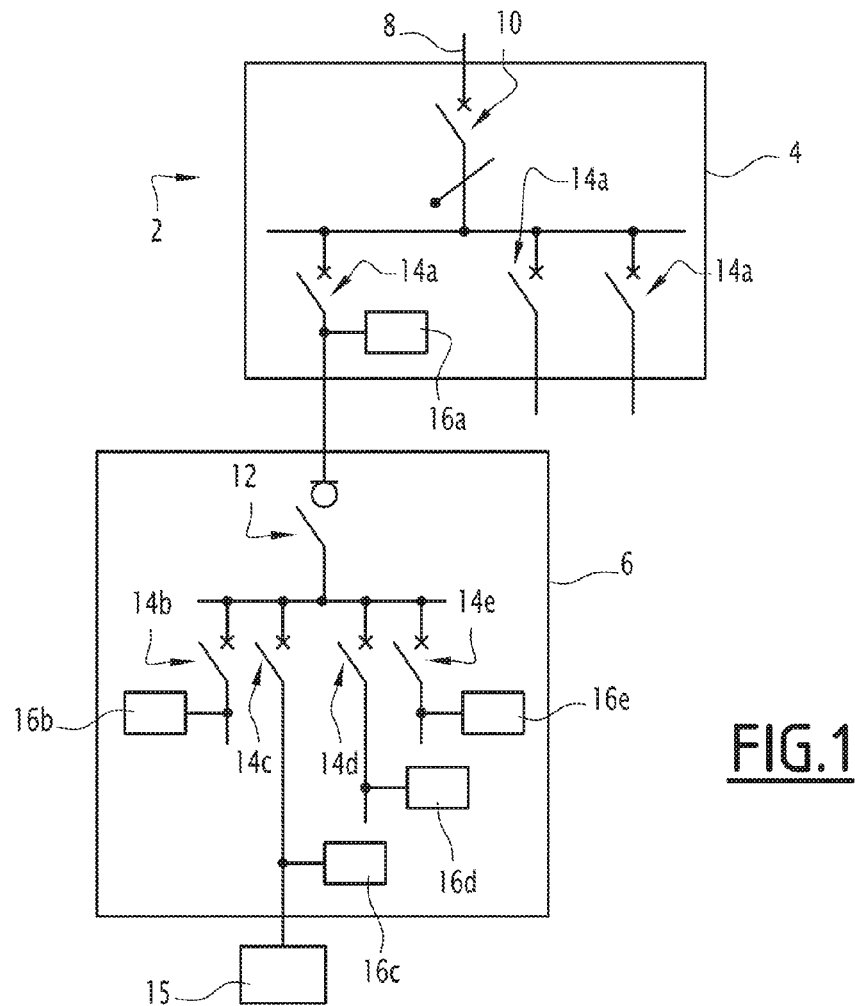

2003/0085715 A1* 5/2003 Lubkeman ........... G01R 31/086
                                                    324/509
2003/0184931 A1   10/2003 Morris
2004/0024545 A1*  2/2004 Tian ................. H02H 5/105
                                                    702/60
2008/0024142 A1*  1/2008 Opfer ................ H01H 75/04
                                                    324/555

* cited by examiner

SAFETY DEVICE AND METHOD FOR AN ELECTRIC INSTALLATION

The present invention relates to a safety device for an electric installation capable of being connected between a circuit breaker device and an electric installation powered by an electric grid providing three-phase current having a first associated frequency, using a line for conveying electric current including three phase conductors, a neutral conductor and a protection conductor, the device making it possible to verify at least one electric safety condition following a cut off of electric power of the electric installation by the circuit breaker device. The present invention also relates to an associated safety verification method.

The invention belongs to in the field of the distribution of electricity to industrial electric installations consuming high power.

In a known manner, high-power industrial electric installations are powered by an electricity provider, via an electricity distribution grid.

In order to protect the various electric installations of an electric system, it is known to place safety devices, such as circuit breakers, on the power supply lines of various electric installations, making it possible to cut a supply of electricity in case of overvoltage or incident, so as to avoid damaging the electric installations of such a system.

If an incident occurs, for example an overvoltage, a maintenance operator intervenes to repair or replace defective equipment that is the source of the incident, to then restore operation of the electric system. The restoration of operation is accompanied by "closing" the circuit breaker(s), which makes it possible to restore electricity to the installations. There is a safety risk for a maintenance operator performing this service restoration operation, in particular in the case of power installations, since there is a risk of a short-circuit existing downstream from the circuit breaker, which may cause effects that risk injuring the operator.

Various systems have been proposed to detect a potential presence of a short-circuit in order to increase safety for maintenance operators.

Aside from the presence of a short-circuit, it is also possible that the electric system to be restored to service may have a residual voltage coming from a source situated downstream from the circuit breaker, which also places a maintenance operator in danger and risks damaging various components of the installation.

For example, when an electricity distribution system including several electric installations is powered by a three-phase electric current, at 690 V and having a frequency of 50 Hz, a residual voltage greater than 50 V and less than or equal to 690 V may be present.

U.S. Pat. No. 6,034,447 describes a circuit making it possible to test the presence of a short-circuit, but does not apply in the case of a supply of electric current by a three-phase distribution grid, including three phase conductors, a neutral conductor and a protection conductor, but only in the case of a single-phase distribution grid. Furthermore, the circuit proposed in this document requires an expensive switch, inasmuch as it must be able to support all possible overvoltages.

There is a need to improve security systems before restoring service for an electric distribution system, after a circuit breaker, in terms of cost, efficiency and safety.

To that end, according to a first aspect, the invention proposes a safety device of the aforementioned type, comprising means for verifying the presence of a residual voltage above a predetermined safety threshold on at least one of the conductors and means for verifying isolation, capable of verifying the isolation between two conductors of at least one pair of conductors, called the tested pair of conductors, among said phase conductors.

Advantageously, the device according to the invention comprises means for verifying the presence of a residual voltage and means for verifying the isolation between phase conductors; there are therefore several cumulative safety conditions.

According to one particular feature, the isolation verification means of the device according to the invention are capable of verifying each pair of phase conductors, as well as each phase conductor in the neutral conductor or the protection conductor.

Thus, advantageously, all of the pairs of conductors from among the set of three-phase current conductors are tested, exhaustively, making it possible to increase safety.

The safety device according to the invention may also have one or more of the features below:
the isolation verification means include a module for injecting a high-frequency electric signal, having a voltage below a voltage threshold, and a second frequency above said first frequency, and a multiplexing circuit making it possible to inject said high frequency electric signal toward each pair of conductors to be tested;
the isolation verification means further include, connected at the output of the multiplexing circuit, and connected to said phase conductors, an injection filter of the high pass type, with a cutoff frequency above said first frequency of the three-phase current and below said second frequency of the high-frequency electric signal;
the multiplexing circuit of the injected high-frequency electric signal comprises a set of switching members arranged to produce coupling between said conductors of the current conveying line of the three-phase electric grid and the injected high-frequency electric signal;
the multiplexing circuit comprises five switching members each having an input switchable on one output from among two outputs, connected such that each of the electric conductors of the current conveying line of the grid is connected on at least one output of a switching member;
each phase conductor is connected at its output to two separate switching members;
it comprises a measurement adaptation module and a voltage measurement circuit connected on the output of the measurement adaptation module and capable of performing a voltage measurement indicating the presence of a residual voltage and an impedance measurement indicating the absence of an electric isolation fault for each tested pair of conductors;
it comprises a command control member capable of checking said means for verifying the presence of a residual voltage and said isolation verification means;
comprises a man-machine interface capable of receiving commands from an operator and providing indications relative to the verified safety conditions;
the man-machine interface comprises luminous indicators capable of providing indications relative to the verified safety conditions.

According to a second aspect, the invention relates to a method for verifying safety implemented by a safety device connected between a circuit breaker device and an electric installation powered by an electric grid providing three-phase current having a first associated frequency, using a line for conveying electric current comprising three phase conductors, a neutral conductor and a protection conductor, making it possible to verify at least one electric safety condition following an electric power supply cutoff of the electric installation by the circuit breaker device. The verification method according to the invention comprises:

verifying a first safety condition for the presence of a voltage above a predetermined safety threshold on one of the phase conductors, and, if there is no voltage above the security threshold, an isolation verification, capable of verifying the isolation between two conductors of at least one pair of conductors, called tested pair of conductors, among said phase conductors, using at least one man-machine interface of the safety device to display the result upon each verification step.

The advantages of the verification method according to the invention are similar to those of the safety device briefly described above.

According to one embodiment, after verifying the first safety condition, the safety verification method further comprises verifying a second safety condition relative to the loss of connection with one of the phase conductors.

According to one embodiment, in the isolation verification step, all of the pairs of phase conductors, all of the pairs respectively formed by one of the phase conductors and the neutral conductor, and all of the pairs respectively formed by one of the phase conductors and the protection conductor are verified.

Preferably, a risk indicator is implemented on the man-machine interface of the safety device once the isolation verification step indicates a lack of isolation for a pair of conductors.

Preferably, said first and second safety conditions are verified before and after carrying out the isolation verification step.

Figure 2:
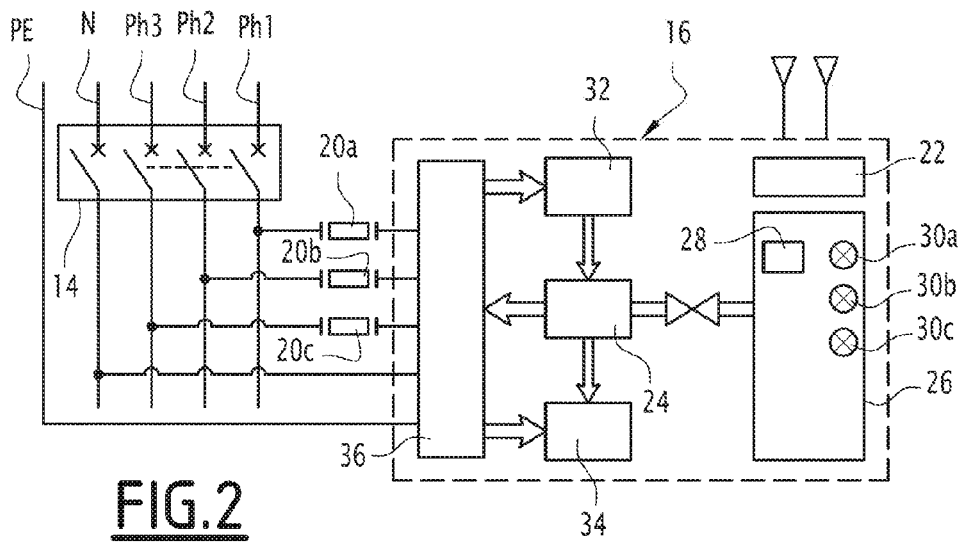
Figure 3:
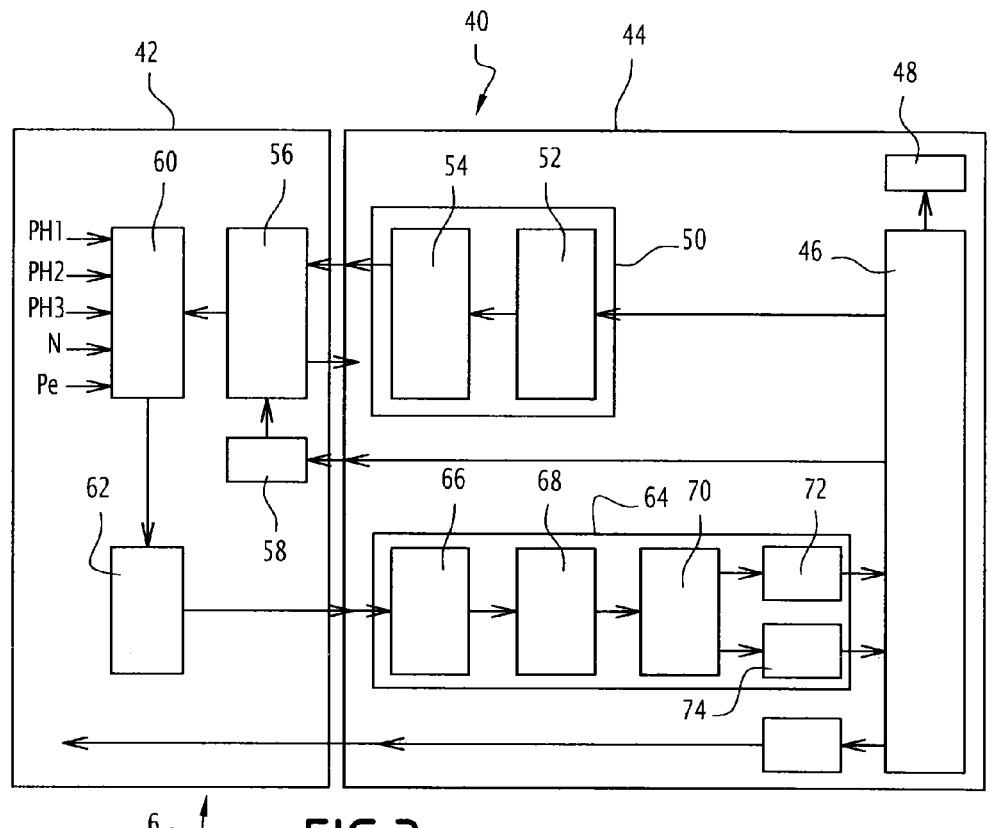
Figure 4:
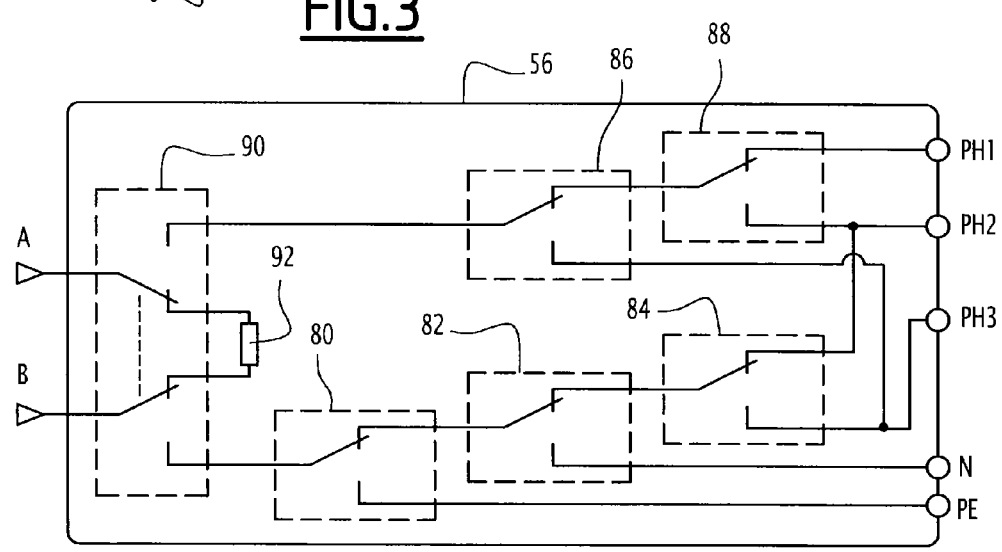
Figure 5:
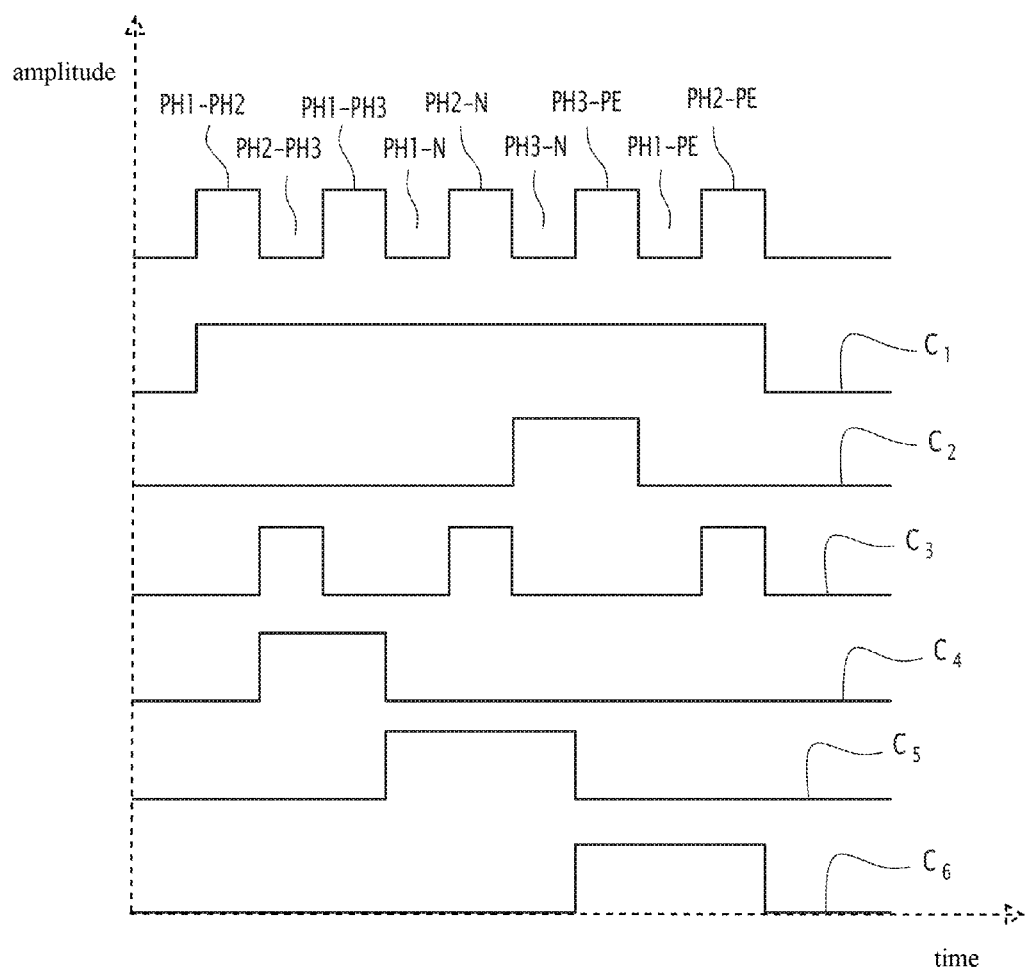
Figure 6:
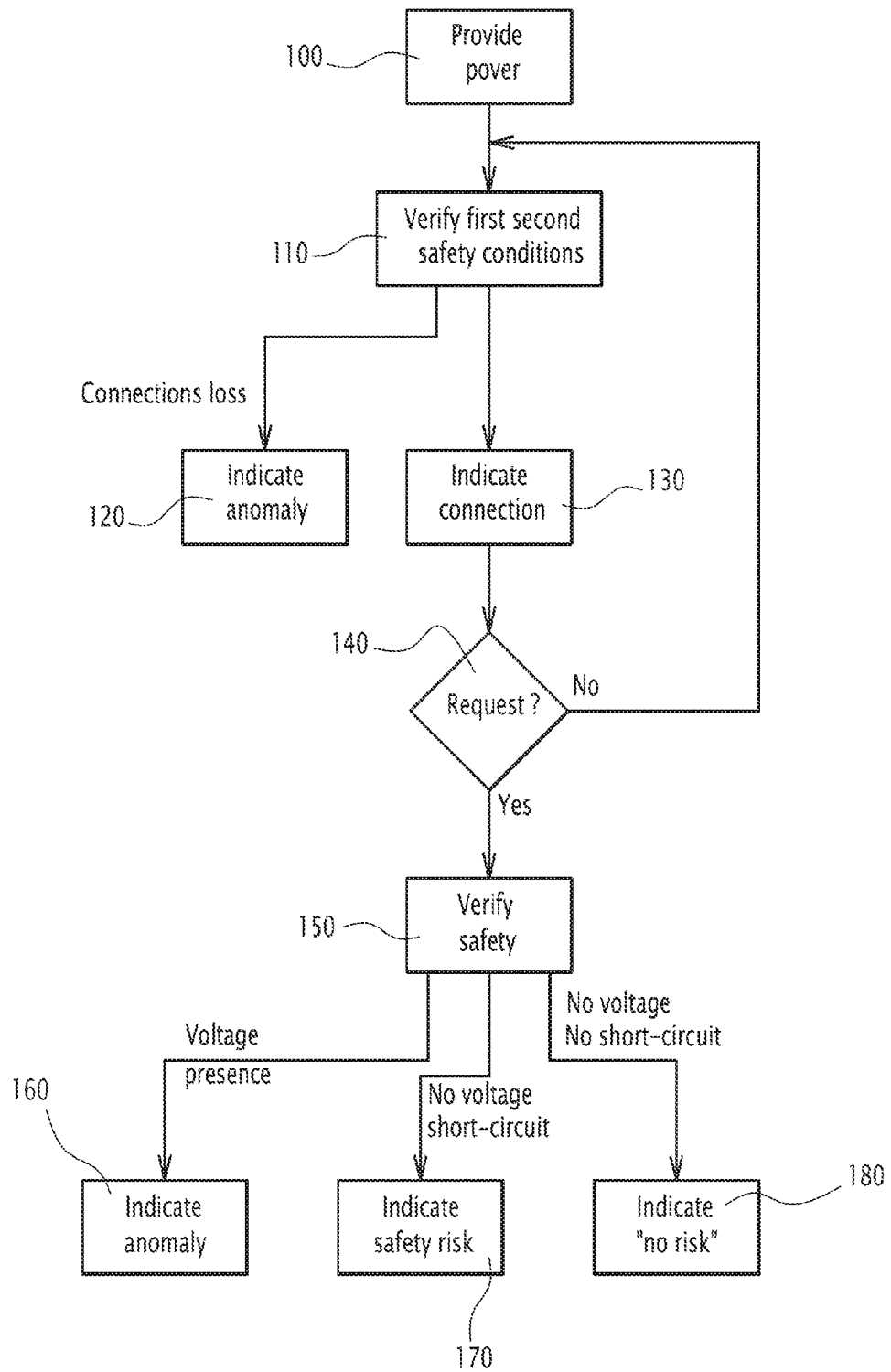

Other features and advantages of the invention will emerge from the description thereof provided below, for information and non-limitingly, in reference to the appended figures, in which:

FIG. 1 diagrammatically shows an electric distribution system using safety devices according to the invention;

FIG. 2 diagrammatically shows a set of functional blocks of a safety device according to the invention;

FIG. 3 diagrammatically shows one embodiment of a safety device according to the invention;

FIG. 4 diagrammatically shows one embodiment of a multiplexing circuit;

FIG. 5 illustrates injection electric signal combinations;

FIG. 6 diagrammatically shows one embodiment of a measuring circuit.

FIG. 1 diagrammatically illustrates an example of an electricity distribution system 2 in which the invention is applicable. Thus, the general principle of the invention will be described below, in particular in reference to that figure.

The electricity distribution system 2 comprises two electric distribution panels, respectively denoted 4 and 6 in the figure, which can be physically located in different buildings, for example of an industrial site. The system 2 allows the power supply of various electric power installations 15, also called loads, connected in this example to the electric panel 6.

The electric panel 4, called main panel, is directly supplied, via an electric current routing line 8, with a three-phase electric current provided by an electricity distributor, for example EDF ("Electricité de France"). The electric current routing line 8 comprises three phase conductors denoted PH1, PH2, PH3 and visible in FIG. 2, optionally a neutral conductor N and a protection conductor PE connected to the ground.

Each electric panel 4, 6 comprises a main switch, respectively referenced 10 for the electric panel 4 and 12 for the electric panel 6, making it possible to cut the arrival of electric current on the power supply line 8. Furthermore, circuit breaker devices 14a, 14b, 14c, 14d and 14e are placed on the various power supply lines of the distribution system 2, so as to protect the various components of the distribution system in case of incident, in particular in case of overvoltage due to a defective load connected to the distribution system.

Thus, when an incident occurs, the circuit breaker device cuts the supply of current, and therefore places itself in the open position. A maintenance operator can then intervene to eliminate the source of the incident, and thus restore the distribution system 2 to service by closing the affected circuit breaker device.

In order to ensure better safety for a maintenance operator, safety devices 16a, 16b, 16c, 16d and 16e are added in the energy distribution system, each safety device 16a to 16e being connected downstream from an associated circuit breaker device 14a to 14e.

Each safety device according to the invention is capable of verifying several safety conditions, namely, a first safety condition that is the presence of electric voltage downstream from the associated circuit breaker device, optionally a second safety condition that consists of verifying any loss of a connection of the safety device to a phase conductor, and lastly a third safety condition relative to the potential presence of a short circuit between phase conductors and/or between each phase conductor and the neutral and protection conductors.

FIG. 2 diagrammatically illustrates a set of functional blocks of a safety device 16 according to the invention.

A safety device 16 is connected to each of the phase conductors PH1, PH2, PH3 of the power supply line, downstream from an associated circuit breaker device 14, by means of protection members of the fuse type 20a, 20b, 20c. These protection members 20a, 20b, 20c make it possible to isolate the safety device 16 from the phase conductors for any intervention on the safety device, and also to avoid causing a short circuit between the phase conductors PH1, PH2, PH3 in case of fault of the safety device 16.

The safety device 16 is powered by an outside direct current source with a voltage of 24 V, for example via a power supply block 22.

The safety device 16 comprises a command control functional block 24, connected to the man-machine interface block 26, making it possible to obtain user commands, for example via command buttons 28, and to display results of safety tests carried out by the safety device, for example using luminous indicators 30a, 30b, 30c.

The command control block 24 controls a verification block 32 which verifies the presence of voltage, capable of verifying the presence of a residual voltage, preferably below 50 V, for example equal to 30 V, with a given frequency for example equal to 50 Hz. This is the case if a power supply source is connected downstream from the associated circuit breaker device 14, despite the fact that that circuit breaker device 14 is itself in the cutoff position for the upstream power supply.

Furthermore, the safety device 16 comprises a measurement block 34, connected to a multiplexing block 36, which are capable of generating a high-frequency, low-voltage injection electric signal, for example with a voltage below 50 V, frequency 50 kHz, between the various phase conductors PH1, PH2, PH3, neutral conductor N, protection conductor PE according to various possible combinations, and to measure a short circuit impedance, making it possible to detect a potential presence of a short circuit between the conductors.

In one embodiment as illustrated in FIG. 2, the functions of verifying for the presence of voltage and of measuring short circuit impedance are carried out, advantageously, by a same verification and measuring circuit that will be described in more detail below.

According to one embodiment illustrated in FIG. 3, a safety device 40 is made up of two electronic blocks 42, 44, connected by a connection block that is not shown, the block 42, connected to the three-phase current routing line, being capable of supporting an electric power signal, having a voltage of 690 V, and the block 44 being capable of performing low-voltage measuring operations designed to verify safety conditions before restoring service to the circuit breaker device associated with the safety device.

The electronic block 42 is supplied by a 24 V external direct current power source, as explained above.

The block 44 comprises computation means, for example such as a microprocessor 46 capable of performing command and control functions, in connection with a man-machine interface 48 allowing an interaction with an operator.

The microprocessor 46 is capable of commanding an injection module 50 of a high-frequency, low-voltage electric signal, which is shaped by a module 52 and amplified by a power amplification module 54, before being injected toward a multiplexing circuit 56. The multiplexing circuit 56 is commanded by a command module 58, capable of commanding switching members making it possible to select a pair of conductors to be tested from among all of the three-phase current conductors. One embodiment of the multiplexing circuit 56 will be outlined below in reference to FIG. 4.

The output of the multiplexing circuit 56 is connected at the input of a high-pass injection filter 60, which is also connected to the phase conductors PH1, PH2, PH3, the neutral conductor N and the protection conductor PE.

The high-pass injection filter 60 is a filter of the RC type, having a cutoff frequency chosen to allow an injected high-frequency signal to pass and to attenuate, or even cut, a low-frequency, high-voltage electric signal, coming from the phase conductors. For example, in one embodiment, the high-pass injection filter 60 is made up of resistances of 1 Kilo-Ohms and capacitances of 33 nF (nano Farads), which makes it possible to obtain a cutoff frequency of 4.822 kHz.

The output of the injection filter 60 is connected to the input of the measuring adaptation module 62, the purpose of which is to make it possible to adapt the injected electric signal in order to verify the isolation between conductors and to verify any presence of a short circuit on the one hand, and to adapt an electric signal of the network in order to verify the presence of residual voltage.

The measuring adaptation module 62 is advantageously made to withstand any disruptions present on the electric grid, of the lightning wave type.

In one embodiment, the measuring adaptation module 62 is made by a circuit that performs filtering capable of cutting an electric signal with a frequency below 10 kHz. This filter is designed to allow the injection frequency to pass and to attenuate the grid frequency.

The measuring adaptation module 62 is connected to a measuring circuit 64, which is part of the electronic block 44. The measuring circuit 64 is made up of a protection filtering module 66, a measurement multiplexing module 68, and an amplification and rectifying module 70. The amplification and rectifying module 70 has two outputs, one output toward a filtering module 72, which is an integrator filter with mean value 50 kHz, and an output toward a filtering module 74, comprising a voltage dividing bridge and an integrator filter with mean value 50 Hz.

The filtering module 72 makes it possible to provide a voltage measurement value between two conductors of a tested pair of phases or between one of the phase conductors and the neutral conductor or the protection conductor, making it possible to obtain a resistance (or impedance) value that is next compared to a predetermined isolating threshold in order to determine whether the isolation condition between the pair of conductors is met or if, on the contrary, a short circuit is present between the two conductors of the tested pair of conductors. The isolation condition is preferably given by an isolation resistance threshold, in the vicinity from several ohms to several tens of ohms. If the value obtained by measurement is below the isolation resistance threshold, a short circuit is detected.

If the isolation condition indicates that a short circuit is present between the two conductors of the tested pair of conductors, a risk of safety fault is signaled to the operator via the man-machine interface 48 of the safety device 40.

The filtering module 74 provides a voltage presence measurement value at 50 Hz, between two conductors of a tested pair of phases or between one of the phase conductors PH1, PH2, PH3, and the protection conductor or the neutral conductor, for a voltage range above 50 Volts. If a voltage is detected, an appropriate signal is sent to the operator via the man-machine interface 48 of the safety device. Furthermore, any isolation verification signal injection is inhibited if voltage is detected.

FIG. 4 illustrates an embodiment of a multiplexing circuit 56 for injection electric signals. In this embodiment, the multiplexing circuit is made up of a plurality of switching members 80, 82, 84, 86, 88, which are preferably electrochemical relays, with one input and two outputs, allowing switching from an input conductor to one of two possible outputs. The switching members are connected so as to allow coupling between the phase conductors PH1, PH2, PH3, the neutral conductor, the protection conductor PE and the injection electric signal provided on the input A, B. Furthermore, the multiplexing circuit 56 comprises an inverter switching member 90, connected to a test resistance 92, making it possible to disconnect the injection module 60 from the electric grid.

The cabling of the switching members 80 to 90 makes it possible to produce all measurement combinations to verify the isolation and to verify a potential short circuit between the pairs of conductors, i.e., between pairs of phase conductors: (PH1, PH2), (PH1, PH3), (PH2, PH3); between each phase conductor and the neutral conductor: (PH1, N), (PH2, N), (PH3, N); between each phase conductor and the protection conductor (PH1, PE), (PH2, PE), (PH3, PE).

Advantageously, the selected cabling makes possible to use the minimum number of switching members 80 to 90 to produce the set of connections to be tested, thus making it possible to minimize the total bulk and cost of the safety device.

The multiplexer circuit 56 comprises five switching members 80, 82, 84, 86, 88 having one input switchable on one output from among two outputs, connected such that each of the electric conductors PH1, PH2, PH3, N, PE of the routing line of the grid is connected on at least one output of a switching member 80, 82, 84, 86, 88.

Furthermore, in the embodiment of FIG. 4, each phase conductor PH1, PH2, PH3 is connected at the output of two separate switching members from among the five switching members 80, 82, 84, 86, 88.

Preferably, the contact resistance between the switching members is as low as possible to avoid a voltage drop. Preferably, the contact resistance of each switching member is below 50 milliohms, which makes it possible to have a total resistance, in the worst-case scenario, of 7×50 mOhm=350 milliohms.

With the cabling illustrated in FIG. 4, the command module 58 applies the following commands to obtain multiplexing of the injection signal on each of the pairs of conductors to be tested, as illustrated in FIG. 5. For each switching member, an associated command signal is shown in FIG. 5. The command signal C1 is associated with the switching member 90, C2 with the switching member 86, C3 with the switching member 88, C4 with the switching member 84, C5 with the switching member 82 and C6 with the switching member 80.

pair (PH1, PH2): command of the switching member: 90
pair (PH2, PH3): command of the switching members 90, 84, 88;
pair (PH1, PH3): command of the switching members 90, 84;
pair (PH1, N): command of the switching members 90, 82;
pair (PH2, N): command of the switching members 90, 82, 88;
pair (PH3, N): command of the switching members 90, 82, 86;
pair (PH1, PE): command of the switching members 90, 80;
pair (PH2, PE): command of the switching members 90, 80, 88;
pair (PH3, PE): command of the switching members 90, 80, 86;

Thus, advantageously, all of the combinations are tested, with a minimal number of switching members.

FIG. 6 illustrates the main steps of a method for verifying safety conditions implemented by a safety device as described above.

Preferably, the safety device continuously measures a first safety condition, which is the presence of voltage on the phase conductors PH1, PH2, PH3. The verification of the presence of a short circuit between conductors is only carried out when it is guaranteed that no voltage above a safety threshold, which is preferably less than 50 V, for example equal to 30 V for a very low safety voltage, is present on the phase conductors.

Furthermore, the safety device verifies a second safety condition, which is the loss of a connection with a phase conductor, due to a defective fuse 20a, 20b, 20c or a connection problem. The verification of isolation between conductors in order to validate a lack of short circuit, which is a third safety condition, is only carried out after these two safety conditions have been verified.

Preferably, the first and second safety conditions are validated again after the third safety condition has been validated.

The main steps of a method according to the invention are illustrated in FIG. 6. A first step 100 for providing power (24 V) to the safety device is implemented. A luminous indicator showing that the device is powered-on, visible on one face of the safety device, is then lit.

It is followed by verification 110 of the second safety condition, i.e., the potential loss of a connection with one of the phase conductors.

In the case of connection loss, for example due to an out-of-service fuse, a luminous indicator is lit in step 120, to indicate that anomaly to the maintenance operator. For example, a blinking yellow indicator 30c indicates that anomaly.

In the case where the lost connection verification is negative, step 110 is followed by a step 130 in which a luminous indicator, for example the same indicator 30c, is extinguished.

At any time, an operator can act on a button, for example the button 28, to request a safety test. The verification of the arrival of such a request from an operator is carried out in step 140. As long as no safety verification request is submitted by an operator, the method returns to step 110 previously described.

Thus, advantageously, the status of the connection with the phase conductors is monitored continuously.

If there is a safety verification request in step 140, a safety verification step 150 is triggered, including a first verification of the presence of a voltage above the given safety threshold. If such a presence is detected, the luminous indicator 30c lights up during step 160 to indicate that it is impossible to continue the conductor isolation verification. Thus, no high-frequency electric signal is injected for the isolation test by pairs of conductors.

If no voltage above the safety threshold is detected for any of the phase conductors, then the set of conductor pairs is also tested by injecting a high-frequency electric signal, such as described above at page 6, lines 15-21 or at page 7, lines 4-10, for instance, as part of the safety verification step 150.

If the presence of a short circuit is detected on one of the tested pairs of conductors, a luminous indicator 30b indicating that short-circuit presence is lit in step 170. Thus, the operator is warned of a safety risk, and therefore does not bring the electricity distribution system back into service by closing the circuit breaker device upstream from the safety device. For example, the luminous indicator 30b is lit in red. Any other means for indicating a safety risk using the man-machine interface of the safety device can be used as an alternative.

Lastly, if no short circuit is detected, then a luminous indicator 30a indicating that the verifications of safety conditions have yielded a positive result is lit in step 180. For example, the luminous indicator 30a is lit in green.

It should be noted that all signaling alternatives of the tests of safety conditions, with several separate luminous indicators, for example, can be considered as an alternative.

Advantageously, several safety conditions are tested, and the results are indicated to the operator on the man-machine interface of the safety device, which makes it possible to gain reliability and maintenance time. Furthermore, the accumulation of testing several safety conditions makes it possible to improve operator safety, as well as to decrease the risks of damage to the components.

The invention claimed is:

1. A safety device adapted to be connected between a circuit breaker device and an electric installation powered by an electric grid providing three-phase current having a first associated frequency, using a line for conveying electric current comprising three phase conductors, a neutral conductor and a protection conductor, the safety device making it possible to verify at least one electric safety condition following a cut off of electric power of the electric installation by the circuit breaker device, comprising:
   a module adapted to verify presence of a residual voltage above a predetermined safety threshold on at least one of the conductors; and
   an isolation verification module adapted to verify isolation between at least one tested pair of conductors of at least one pair of conductors, from among said three phase conductors in combination,
   wherein the isolation verification module includes:
   a module adapted to inject a high-frequency electric signal, having a voltage below a voltage threshold, and a second frequency above said first associated frequency,
   and a multiplexing circuit adapted to inject the high-frequency electric signal only on a pair of conductors basis toward each pair of conductors to be tested that form the at least one tested pair of conductors.

2. The safety device according to claim 1, wherein the isolation verification module is adapted to verify each pair of phase conductors.

3. The safety device according to claim 1, wherein the isolation verification module is further adapted to verify the isolation of each pair of conductors formed by each of said phase conductor and the neutral conductor, and each pair of conductors formed by each of said phase conductors and the protection conductor.

4. The safety device according to claim 1, wherein the isolation verification module further includes, connected at an output of the multiplexing circuit, and connected to said phase conductors, a high pass injection filter with a cutoff frequency above said first associated frequency of the three-phase current and below said second frequency of the high-frequency electric signal.

5. The safety device according to claim 1, wherein the multiplexing circuit has a set of switching members arranged to produce coupling between said conductors of the line for conveying electric current of the three-phase electric grid and the injected high-frequency electric signal.

6. The safety device according to claim 5, wherein the multiplexing circuit is comprised of five switching members each having an input switchable on one output from among two outputs, connected such that each of the electric conductors of the line for conveying electric current of the three-phase electric grid is connected on at least one output of one of the switching members.

7. The safety device according to claim 6, wherein each phase conductor is connected as an output of two separate switching members.

8. The safety device according to claim 4, further comprising a measurement adaptation module and a voltage measurement circuit connected on an output of the measurement adaptation module and capable of performing a voltage measurement indicating the presence of a residual voltage and an impedance measurement indicating the absence of an electric isolation fault for each of the at least one tested pair of conductors.

9. The safety device according to claim 1, further comprising a command control member capable of controlling said module adapted to verify the presence of a residual voltage and of controlling said isolation verification module.

10. The safety device according to claim 9, further comprising a man-machine interface capable of receiving commands from an operator and providing indications relative to the verified at least one electric safety conditions.

11. The safety device according to claim 10, wherein the man-machine interface includes luminous indicators capable of providing indications relative to the verified at least one electric safety conditions.

12. A method for verifying safety implemented by a safety device connected between a circuit breaker device and an electric installation powered by an electric grid providing three-phase current having a first associated frequency, using a line for conveying electric current comprising three phase conductors, a neutral conductor and a protection conductor, making it possible to verify at least one electric safety condition following an electric power supply cutoff of the electric installation by the circuit breaker device, comprising:
   verifying a first safety condition for the presence of a residual voltage above a predetermined safety threshold on one of the phase conductors, when there is no residual voltage above the predetermined safety threshold, applying an isolation verification, capable of verifying the isolation between at least one tested pair of conductors of at least one pair of conductors, from among said three phase conductors in combination,
   and using at least one man-machine interface of the safety device to display a result upon each said isolation verification,
   wherein said isolation verification includes:
   injecting a high-frequency electric signal having a voltage below a voltage threshold, and a second frequency above the first associated frequency, only on a pair of conductors basis toward each pair of conductors to be tested that form the at least one tested pair of conductors.

13. The safety verification method according to claim 12, wherein after said verifying the first safety condition, the method further comprises verifying a second safety condition relative to a loss of connection with one of the phase conductors.

14. The safety verification method according to claim 13, wherein in said isolation verification, all of the pairs of phase conductors, all of the pairs respectively formed by one of the phase conductors and the neutral conductor, and all of the pairs respectively formed by one of the phase conductors and the protection conductor are verified.

15. The safety verification method according to claim 14, wherein a risk indicator is implemented on the man-machine interface of the safety device once said isolation verification indicates a lack of isolation for a pair of conductors of the at least one tested pair of conductors.

16. The safety verification method according to claim 14, wherein said first and second safety conditions are verified before and after carrying out the applying the said isolation verification.

* * * * *